United States Patent
Yuzawa

(10) Patent No.: US 6,221,728 B1
(45) Date of Patent: Apr. 24, 2001

(54) SEMICONDUCTOR DEVICE MANUFACTURING METHOD

(75) Inventor: Osamu Yuzawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/265,345

(22) Filed: Mar. 9, 1999

(30) Foreign Application Priority Data

Mar. 9, 1998 (JP) .................................................. 10-055639

(51) Int. Cl.[7] .................................................... H01L 21/20
(52) U.S. Cl. ............................ 438/382; 438/384; 438/233
(58) Field of Search .............................. 257/536; 438/233

(56) References Cited

U.S. PATENT DOCUMENTS

| 4,419,812 | * | 12/1983 | Topich ................................. 29/571 |
| 4,734,383 | * | 3/1988 | Ikeda et al. ........................... 438/233 |
| 5,013,678 | * | 5/1991 | Winnerl et al. ....................... 438/384 |
| 5,466,484 | * | 11/1995 | Spraggins et al. .................... 438/385 |
| 5,847,442 | * | 12/1998 | Miller, Jr. et al. ................... 257/536 |
| 5,903,027 | * | 5/1999 | Yoshitomi et al. ................... 257/327 |

FOREIGN PATENT DOCUMENTS

| 7-183504 | 7/1995 | (JP) . |
| 7-273321 | 10/1995 | (JP) . |

* cited by examiner

*Primary Examiner*—Carl Whitehead, Jr.
*Assistant Examiner*—William M. Brewster

(57) ABSTRACT

In a method for manufacturing a semiconductor device having a mixture of a MOSFET and a low-resistance resistive element, after etching a tungsten silicide film which will serve as the resistive element to achieve a prescribed shape, thermal processing is performed for the purpose of activating a diffusion layer of the MOSFET, thereby achieving a low-resistance tungsten silicide film.

7 Claims, 2 Drawing Sheets

(a)  24: GATE ELECTRODE  23: GATE OXIDE FILM  25: DIFFUSION LAYER  22: ELEMENT SEPARATION OXIDE FILM  21: SILICON SUBSTRATE (b)  26: TITANIUM SILICIDE (c)  27: CVD OXIDE FILM  28: TUNGSTEN SILICIDE (d)  29: INTERLAYER INSULATION FILM  30

SEMICONDUCTOR DEVICE MANUFACTURING METHOD

BACKGROUND OF THE INVENTION

1. Field of the Invention

The present invention relates to method of manufacturing a semiconductor device, and more particularly to a method of manufacturing a semiconductor device including a mixture of a MOSFET and a low-resistance resistive element, which enables the manufacture of a low-resistance resistive element without an increase in the resistance of the FET gate electrode and diffusion layer.

2. Description of the Related Art

In a circuit that transfers high-speed signals, if the characteristic impedance of the signal transmission line is not matched to the load impedance, the signal will be reflected, resulting in waveform distortion. Even between LSI devices, in order to transfer high-speed signals, it is necessary to provide impedance matching so that unwanted reflections do not occur. In recent years, with advances in multifunctional LSI devices, there has been an increased need to build into an LSI device a termination resistance for the purpose of establishing impedance matching. The termination resistance is a resistance of approximately 50, and it is important that this resistance be of high accuracy. If variations occur in the termination resistance, the establishment of impedance matching becomes impossible, so that the LSI fails to function. In the case of forming a termination resistance element within an LSI device, the problem is to limit the variation in the resistance value. Additionally, with the shrinking of semiconductor feature size, it has become possible to achieve high speeds. However, along with these advances in microfine device technology siliciding of the gate electrode and diffusion layer has been used as a method of limiting an increase in parasitic resistances of the gate electrode and diffusion layer. The smaller device features become, the lower becomes the resistance of silicide to heat, leading to the appearance of an increase in resistance cause by coagulation.

A method of manufacturing a semiconductor device in which a MOS transistor such as in the past is combined with a termination resistance element is described below, with reference being made to FIGS. 2 (*a*) through (*d*).

As shown in FIG. 2 (*a*), onto a silicon substrate 21 is formed an element separation oxide film 22 of approximately 400 nm, a gate oxide film 23 of approximately 5 to 10 nm, and a gate electrode 24 of approximately 150 to 200 nm, after which a side wall is formed on the gate electrode and after ion implantation, thermal processing is performed to form a diffusion layer 25, these elements being formed by known technologies, resulting in the formation of a MOS transistor.

Next, as shown in FIG. 2 (*b*) a sputtering method is used to form titanium to a thickness of approximately 30 to 50 nm, and RTA (rapid thermal annealing) is performed at approximately 700° C., so as to form titanium silicide 26 on the diffusion layer. Then, the unreacted titanium is removed.

Next, as shown if FIG. 2 (*c*), a CVD oxide film 27 is formed to a thickness of approximately 100 to 200 nm, and a tungsten silicide 28, which will serve as a resistive element, is sputtered onto the CVD oxide film 27 to a thickness of approximately 100 to 200 nm. Additionally, a photolithography process and anisotropic etching are used to pattern the tungsten silicide 28.

Next, as shown in FIG. 2 (*d*), an interlayer insulation film 29 is formed to a thickness of approximately 1000 nm, after which a contact hole 30 is formed, and thermal processing (RTA) is performed at approximately 750 to 800° C. in order to lower the resistance of the tungsten silicide, because of low temperature of approximately 750 to 800° C.

Then, an aluminum electrode is formed.

Because in the above-noted manufacturing method tungsten silicide is formed after titanium siliciding over the gate electrode and the diffusion layer, it is not possible to achieve a low enough resistance in the tungsten silicide. Additionally, it is difficult to limit the variation in the resistance value that is required for building a termination resistance inside of an LSI device to within 10%. In order to achieve a sufficiently low tungsten silicide resistance and limit variation therein, it is necessary to perform thermal processing, for approximately 20 minutes if done at 700° C. and for approximately 1 minute if done at 800° C. However, because of the low thermal resistance of titanium silicide, if this type of thermal processing is performed after the formation of the titanium silicide, the titanium silicide will coagulate, resulting in an increase in the resistance. That is, the resistance of the gate electrode and the diffusion layer will increase, and the performance of the transistor will suffer. The above-describe method, therefore, is not a suitable method for the formation of a termination resistance that is required to be a low resistance value and also have high accuracy, which is why there has been a need for the development of a method of forming a low-resistance termination resistance.

Accordingly, it is an object of the present invention to provide a method of manufacturing a semiconductor device in which there is a mixture of a MOSFET and a low-resistance resistive element, and which enables the manufacture of a low-resistance resistive element having high accuracy, without an increase in the resistance of the FET gate electrode and diffusion layer.

SUMMARY OF THE INVENTION

In order to achieve the above-noted object, the present invention has the following described basic technical constitution.

Specifically, a first aspect of a semiconductor manufacturing method according to the present invention is a method of manufacturing a semiconductor device which has a mixture of a MOSFET and a low-resistance resistive element that is made of tungsten silicide film, wherein etching is done of said tungsten silicide film, which will serve as the resistive element, to a prescribed shape, after which thermal processing for the purpose of activating a diffusion layer of said MOSFET is performed, thereby reducing the resistance of said tungsten silicide film to a low resistance.

In a second aspect of the present invention is a method comprising: a first step of forming a first oxide film after forming a gate electrode, a second step of forming said tungsten silicide film on said first oxide film, and a third step of depositing a second oxide film on said tungsten silicide film.

In a third aspect of the present invention, in the step of etching the tungsten silicide film into a prescribed shape, the tungsten silicide film is etched using the second oxide film as a mask, and the second oxide film is left remaining on the tungsten silicide.

The fourth aspect of the present invention includes: a first step of forming an element separation film on a semiconductor substrate and further forming a gate oxide film and a gate electrode thereon, a second step of forming an oxide film on the semiconductor substrate including the gate electrode, forming a tungsten silicide film on this first oxide film, and forming a second oxide film on this tungsten silicide film, a third step of etching the second oxide film, a fourth step of etching the tungsten silicide film, which will serve as a resistive element, using the second oxide film as a mask, a fifth step of etching the first oxide film using the second oxide film as a mask, a sixth step of performing ion implantation into a region that will become the source and the drain diffusion layer of the MOSFET and then performing thermal processing to achieve activation, and a seventh step of growing titanium over the entire surface and then forming titanium silicide film over the gate electrode and source and drain diffusion region.

In the fifth aspect, in the fourth step, the tungsten silicide film is etched with the second oxide film as a mask, and the second oxide film is left remaining on the tungsten silicide film.

In the sixth aspect, in the fifth step, by etching the first oxide film, a side wall of the gate electrode formed by this first oxide film is formed simultaneously.

In the seventh aspect, in the sixth step, the etched tungsten silicide film is turned into a low-resistance film by thermal processing.

In the eight aspect, in said seventh step, the second oxide film formed on the tungsten silicide film serves to prevent reaction between said titanium and said tungsten silicide film, from being generated.

The present invention is a method for manufacturing a semiconductor having a mixture of an MOS transistor and a low-resistance termination that is a resistive element having good accuracy and, in particular, this method forms the termination resistance element before titanium siliciding the MOS transistor gate electrode and diffusion layer.

FIG. 1 (*a*) through (*e*) show the cross-sectional views of the manufacturing method of the present invention. By etching the tungsten silicide that will serve as the termination resistance element using an oxide film as a mask, and leaving the oxide film on the tungsten silicide, etching of the tungsten silicide when forming the gate electrode side wall is prevented. When performing titanium siliciding on the gate electrode and the diffusion layer, because the second CVD oxide film remains on the tungsten silicide film, there is no reaction between the titanium and the tungsten silicide film.

Therefore, it is possible to form a termination resistance element before titanium siliciding of the gate electrode and diffusion layer. That is, it is possible by performing high-temperature thermal processing for the purpose of activating the diffusion layer that has been ion-implanted, to reduce the resistance of the tungsten silicide to a low value.

DESCRIPTION OF THE PREFERRED EMBODIMENTS

Preferred embodiments of a semiconductor device manufacturing method according to the present invention are described in detail below, with references being made to the relevant accompanying drawings.

Figure 1:
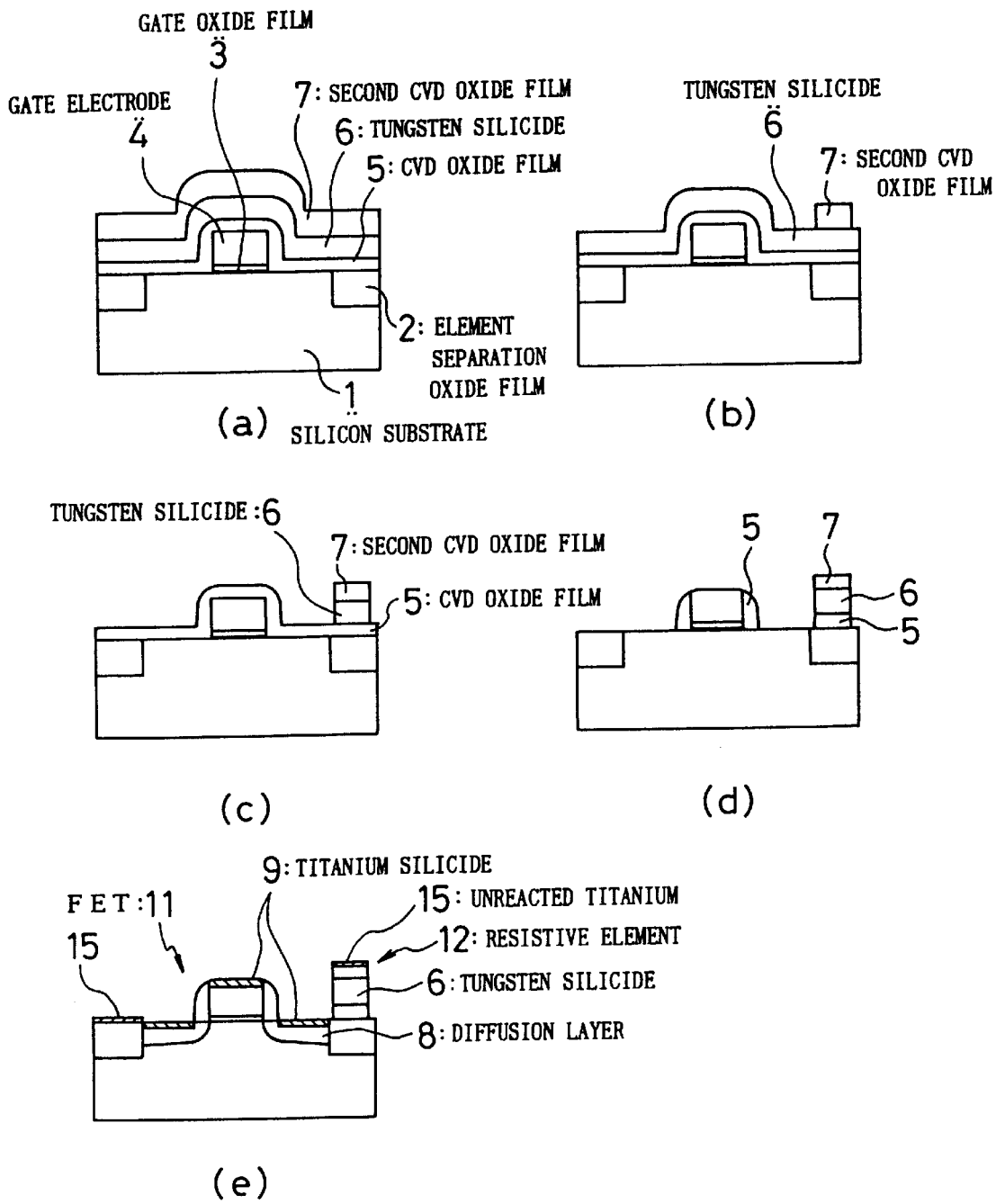
FIGS. 1*a* to 1*e* show the manufacturing process steps in a semiconductor device manufacturing method according to the present invention.
Figure 2:
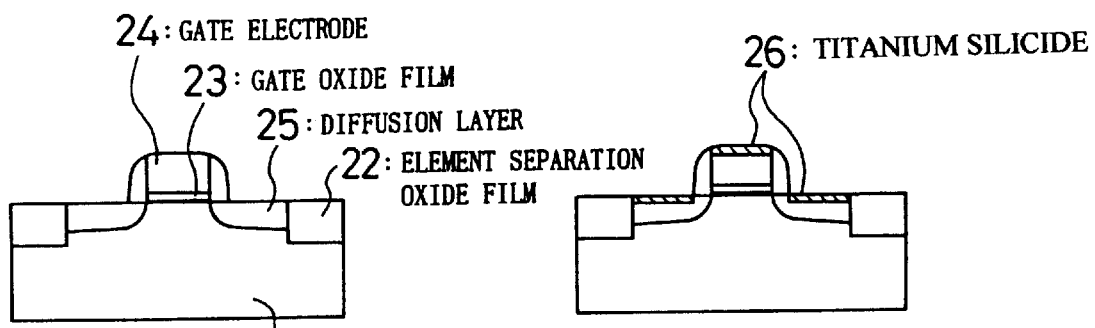
FIGS. 2*a*–2*d* show the manufacturing process steps in a semiconductor device manufacturing method according to the prior art.
Figure 2:
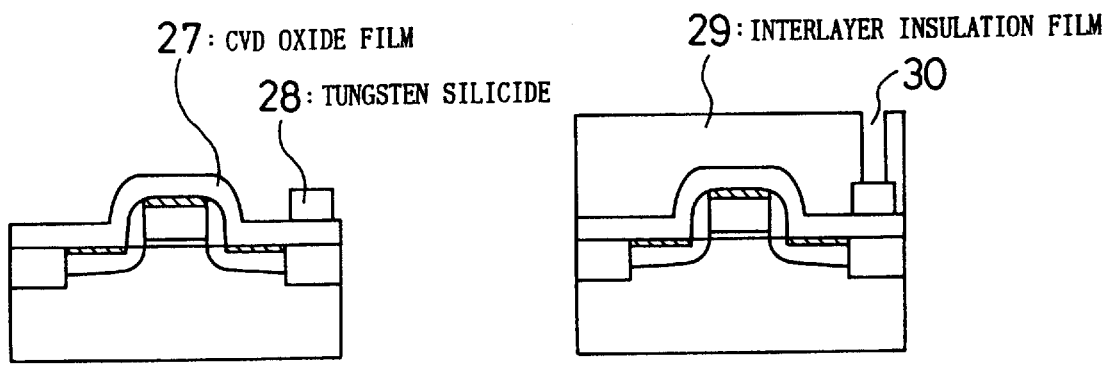

FIG. 1 is a drawing that shows the configuration of an embodiment of the semiconductor manufacturing method according to the present invention. The views of this drawing show a method of manufacturing a semiconductor device that has a mixture of a MOSFET 11 and a low-resistance resistive element 12 that is made of tungsten, whereby after etching tungsten silicide film, which will serve as the resistive element 12, to a prescribed shape, thermal processing for the purpose of activating a diffusion layer 8 of the MOSFET 11 is performed, thereby making the above-noted tungsten silicide film 6 low in resistance.

Next, the method of manufacturing a semiconductor device according to the present invention is described in greater detail below.

As shown in FIG. 1 (*a*), on a silicon substrate, an element separation film 2 of approximately 400 nm, a gate oxide film 3 of approximately 5 to 10 nm, and a gate 4 of approximately 150 to 200 are formed, after which a first CVD (chemical vapor deposition) oxide film, which will serve as a gate electrode side wall, is formed to approximately 100 nm, these being formed by using known technologies. Additionally, sputtering is done of tungsten silicide film 6, which will serve as a termination resistive element, to approximately 100 to 200 nm, over which a second CVD oxide film 7 of approximately 200 to 300 nm is then formed.

Next, as shown in FIG. 1 (*b*), a photolithography process and anisotropic etching are used to pattern the second CVD oxide film 7 on the tungsten silicide film 6.

Then, as shown in FIG. 1 (*c*), anisotropic etching is performed with the second CVD oxide film 7 as a mask.

Next, as shown in FIG. 1 (*d*), a side wall is formed on the gate electrode 4 by etching the first CVD oxide film 5, using anisotropic etching. When doing this, because the second CVD oxide film 7 remains on the tungsten silicide film 6, the tungsten silicide film is not etched.

Next, as shown in FIG. 1 (*e*), ion implantation is done in the region that is to become the source and drain diffusion layer 8, and thermal processing is performed at approximately 900 to 1100° C. to achieve activation. It is possible by this thermal processing to obtain a low-resistance and highly accurate tungsten silicide film 6. Additionally, after forming a titanium film to a thickness of approximately 30 to 50 nm, RTA (rapid thermal annealing) is performed at approximately 700° C. in a nitrogen atmosphere, so as to form a titanium silicide film 9 over the gate electrode 4 and diffusion layer 8. When this is done, because the second CVD oxide film 7 remains on the tungsten silicide film 6, there is no reaction between the titanium and the tungsten silicide film 6.

After the above steps, unreacted titanium 15 is removed, an interlayer insulation film is deposited, and a contact hole is formed, after which an aluminum electrode is formed.

If the first CVD oxide film thickness is A, the second CVD oxide film thickness is B, the tungsten silicide film thickness is W, and the selective etching ratio with respect to the tungsten silicide of the oxide film is S, the condition $B \geq (A+W/S)$ should be satisfied. In actuality, with a selective etching ratio with respect to the tungsten silicide of the oxide film of approximately 2, it is necessary to have a margin of approximately 50 to 100 nm in the thickness of the second CVD oxide film. For example, if the first CVD oxide film thickness is 100 nm, the tungsten silicide film thickness is 200 nm, and the selective etching ratio of the tungsten silicide of the oxide film is 2, the thickness of the second CVD oxide film can be made in the range from 250 to 300 nm.

Thus, the present invention is a method of manufacturing a semiconductor device that has a mixture of a MOSFET an a low-resistance resistive element made from tungsten silicide, this method having a first step of forming an element separation film 2 and further forming a gate oxide film 3, and a gate electrode 4 on a semiconductor substrate; a second step of forming an oxide film 5 on the semiconductor substrate including the gate electrode, forming a tungsten silicide film 6 on this first oxide film 5, and forming a second oxide 7 film on this tungsten silicide film 6; a third step of etching the second oxide film 7; a fourth step of etching the tungsten silicide film 6, which will serve as a resistive element, using the second oxide film 6 as a mask; a fifth step of etching the first oxide film 5 using the second oxide film 7 as a mask; a sixth step of performing ion implantation into a region that will become the source and the drain diffusion layer of the MOSFET and then performing thermal processing to achieve activation of the source and the drain diffusion layer; and a seventh step of growing titanium over the entire surface and then forming titanium silicide film over the gate electrode and source and drain diffusion region.

A feature of this method of manufacturing is that, in fourth step, the tungsten silicide film 6 is etched with the second oxide film 7 as a mask and the second oxide film 7 is left remaining on the tungsten silicide film 6.

Yet another feature is that, by etching the first oxide film 5 in the fifth step, a side wall of the gate electrode 4 is formed simultaneously.

Yet another feature is that, in the sixth step, the etched tungsten silicide film 6 is turned into a low-resistance film by thermal processing.

Yet another feature is that, in the seventh step, the second oxide film 7 prevents reaction between the titanium 15 and the tungsten silicide film 6.

Because the present invention the tungsten silicide film that will serve as a resistive element is formed before the titanium siliciding of the gate electrode and diffusion layer, it is possible to use thermal processing for the purpose of activating the diffusion layer, so as to achieve a tungsten silicide film having low resistance. In this case, compared with the case of the past, the variation in resistance value approximately halved. Because there is no need to perform thermal processing after formation of the titanium silicide film for the purpose of achieving a low-resistance tungsten silicide film, there is no coagulation of the tungsten silicide, which would raise its resistance.

What is claimed is:

1. A method for manufacturing a semiconductor device that has a mixture of a MOSFET and a low-resistance resistive element that is made of tungsten silicide film, consisting essentially of the steps of etching said tungsten silicide film, which will serve as said resistive element, to a prescribed shape, and after etching said tungsten silicide film, thermal processing said semiconductor device for the purpose of activating a diffusion layer of said MOSFET wherein during said thermal processing the resistance of said tungsten silicide film is reduced, depositing an interlayer insulation film over the MOSFET, forming a contact hole in said diffusion layer and forming an aluminum electrode of the semiconductor device, wherein a first oxide film is formed after forming a gate electrode, said tungsten silicide film is formed on said first oxide film, and a second oxide film is formed on said tungsten silicide film.

2. A method of manufacturing a semiconductor device according to claim 1, wherein said second oxide film is used as a mask for etching said tungsten silicide film and said second oxide film remains on said tungsten silicide film.

3. A method of manufacturing a semiconductor device having a mixture of a MOSFET and a low-resistance resistive element that is made of tungsten silicide, said method comprising:

a first step of forming an element separation film on a semiconductor substrate and further forming a gate oxide film and a gate electrode thereon;

a second step of forming an oxide film on said semiconductor substrate including said gate electrode, forming a tungsten silicide film on said first oxide film, and forming a second oxide film on said tungsten silicide film;

a third step of etching said second oxide film;

a fourth step of etching said tungsten silicide film, which will serve as a resistive element, using said second oxide film as a mask;

a fifth step of etching said first oxide film using said second oxide film as a mask;

a sixth step of performing ion implantation into a region that will become the source and the drain diffusion layer of said MOSFET and then performing thermal processing to achieve activation; and a seventh step of growing titanium over the entire surface and then forming titanium silicide film over said gate electrode and source and drain diffusion region.

4. A method of manufacturing a semiconductor device according to claim 3, wherein in said fourth step, said tungsten silicide film is etched with said second oxide film as a mask, and said second oxide film is left remaining on said tungsten silicide film.

5. A method of manufacturing a semiconductor device according to claim 3, wherein in said fifth step, by etching said first oxide film, a side wall of the gate electrode formed by said first oxide film is formed simultaneously.

6. A method of manufacturing a semiconductor device according to claim 3, wherein in said sixth step, said etched tungsten silicide film is turned into a low-resistance film by said thermal processing.

7. A method of manufacturing a semiconductor device according to claim 3, wherein in said seventh step, said second oxide film formed on said tungsten silicide film serves to prevent reaction between said titanium and said tungsten silicide film, from being generated.

* * * * *